United States Patent [19]

O'Shaughnessy et al.

[11] Patent Number: 5,023,567
[45] Date of Patent: Jun. 11, 1991

[54] STABILITY-COMPENSATED OPERATIONAL AMPLIFIER

[75] Inventors: Timothy G. O'Shaughnessy, Norco; Mike Spaur, Laguna Niguel, both of Calif.

[73] Assignee: Western Digital Corporation, Irvine, Calif.

[21] Appl. No.: 533,890

[22] Filed: Jun. 6, 1990

[51] Int. Cl.[5] .......................... H03F 3/45; H03F 3/16
[52] U.S. Cl. ..................................... 330/253; 330/277
[58] Field of Search ............... 330/252, 253, 255, 257, 330/288, 292, 293, 294, 277; 323/315, 316

[56] References Cited

U.S. PATENT DOCUMENTS

| | | | |
|---|---|---|---|
| 4,284,957 | 8/1981 | Hague | 330/255 X |
| 4,714,895 | 12/1987 | Nicollini et al. | 330/253 X |
| 4,868,482 | 9/1989 | O'Shaughnessy et al. | 323/315 X |

Primary Examiner—Steven Mottola
Attorney, Agent, or Firm—Christie, Parker & Hale

[57] ABSTRACT

A stability-compensated, integrated-circuit operational amplifier has an open-loop gain versus frequency characteristic which provides stable and accurate closed-loop operation in numerous overall circuits including a CMOS circuit for producing a precision current as a reference to a digital-to-analog converter. The operational amplifier comprises an inverting node and a non-inverting node, and CMOS circuitry defining two differential amplifiers. Each differential amplifier is connected to the inverting node and the non-inverting node. The first differential amplifier has an output node, and produces on the output node an output potential that defines an output signal having a magnitude that is a function of the magnitude of the difference between a first potential at the inverting node and a second potential at the non-inverting node. The second differential amplifier is also connected to the inverting node and the non-inverting node. The second differential amplifier produces a compensation signal. The operational amplifier further includes capacitive circuitry for coupling the compensation signal to the non-inverting node.

8 Claims, 4 Drawing Sheets

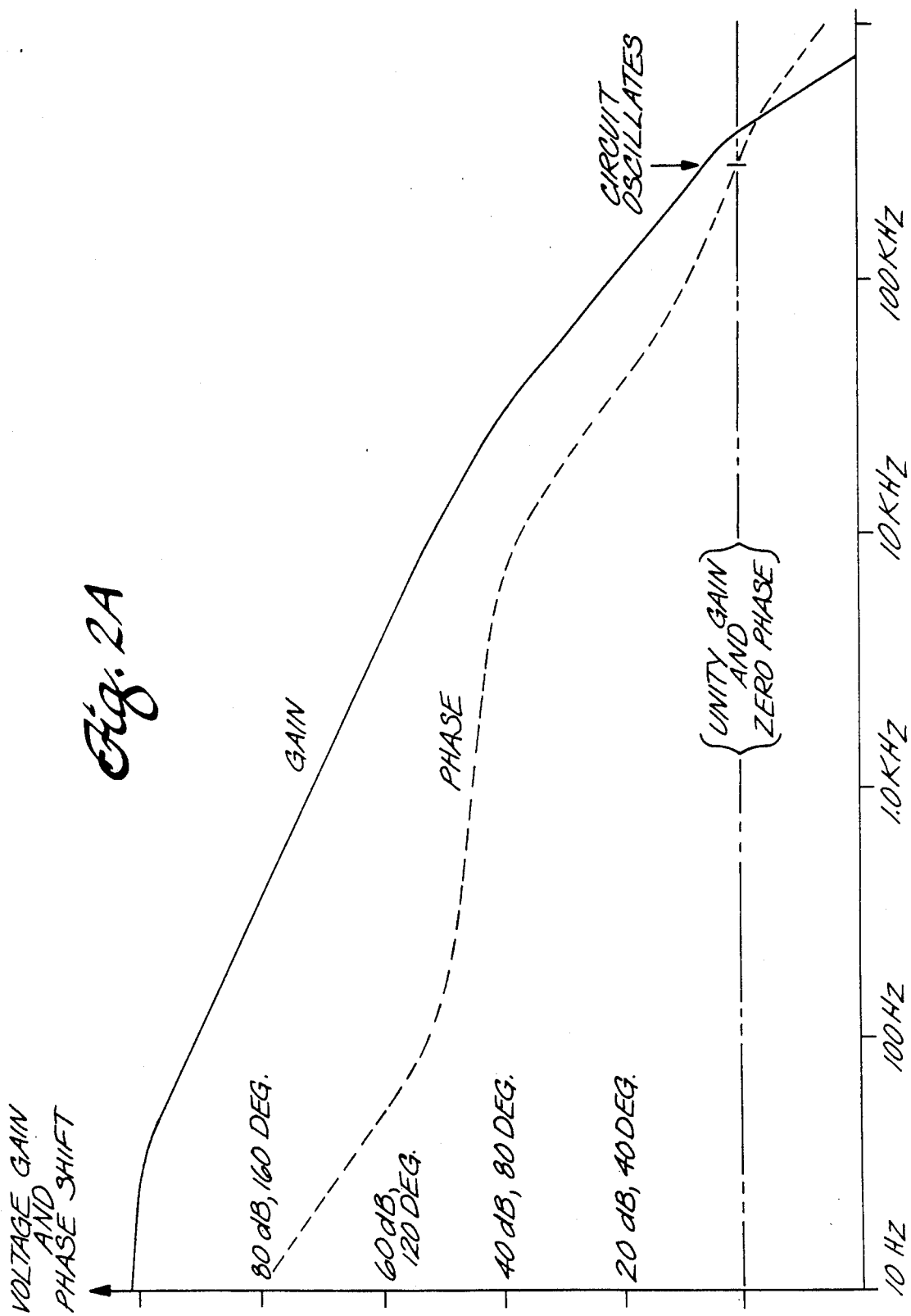

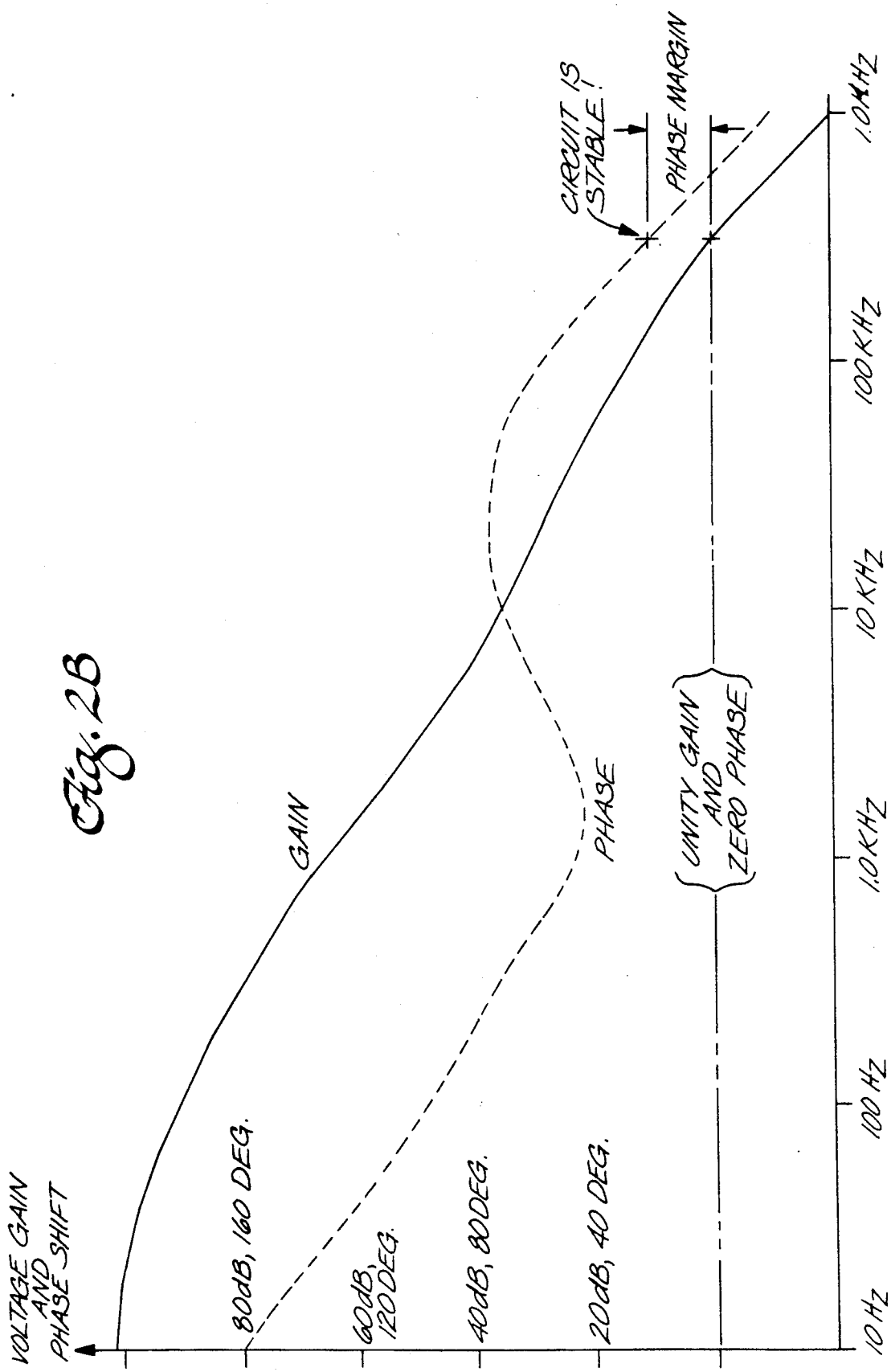

STABILITY-COMPENSATED OPERATIONAL AMPLIFIER

BACKGROUND OF THE INVENTION

1. Field of the Invention

In general, this invention relates to an integrated-circuit operational amplifier. More particularly, it relates to such an amplifier having an open-loop gain versus frequency characteristic which provides stable and accurate closed-loop operation.

2. Description of the Prior Art

An operational amplifier is a specific type of circuit generally classified as a linear or analog circuit. The general function of an operational amplifier is to produce an output signal having a magnitude that is a linear function of the difference between the magnitudes of two input signals, one of which is applied to an inverting input node and the other of which is applied to a non-inverting input node. It is possible to employ a so-called single-ended input stage within an operational amplifier, in which case one of the input nodes is connected to a fixed reference such as ground or 0 volts. In integrated-circuit operational amplifiers, it is generally desirable to employ a differential amplifier as an input stage.

An operational amplifier has utility in numerous circuit arrangements. For example, U.S. Pat. No. 4,868,482, which is assigned to the assignee of the present application, discloses various integrated-circuit operational amplifiers, each of which incorporates a differential amplifier as an input stage. The referenced patent further describes and shows in its FIG. 5 an advantageous arrangement of an operational amplifier which is incorporated as part of an overall circuit for providing a gate-to-source biasing voltage for a field effect transistor (FET) such that the drain-to-source resistance of the FET defines a precision resistor. Additional FETs biased by the same biasing voltage are provided to define additional precision resistors.

As another example of an operational-amplifier application, an operational amplifier can be used within an integrated circuit that provides digital-to-analog conversion, wherein the operational amplifier supplies a precise analog reference signal, either in the form of a reference voltage or reference current.

In each of a variety of overall circuit arrangements in which an operational amplifier can be incorporated, it is highly desirable for the operational amplifier to exhibit certain characteristics. One highly desirable characteristic is high open-loop gain at low frequencies. Another highly desirable characteristic is less than unity open-loop gain at high frequencies at which phase shifts cause positive feedback.

An example that underscores the desirability of high open-loop gain involves an operational amplifier within a voltage-follower circuit arrangement. In such an arrangement, a feedback path is provided such that the output signal of the operational amplifier is applied to an inverting input node of the operational amplifier, and an input signal is applied to a non-inverting input node of the operational amplifier. The following equation gives the magnitude of the output signal ($e_o$) as a function of the magnitude of the input signal ($e_i$) and the open-loop gain (G) of the operational amplifier:

$$e_o = (e_i)(G)/(G+1)$$

As indicated by the foregoing equation, the magnitude of $e_o$ asymptotically approaches $e_i$ as G increases. Generally, the open-loop gain G is subject to substantial variation, because of temperature changes, power supply variations, device tolerances, etc. However, the percentage change in the magnitude of $e_o$ is substantially less than the percentage change in open-loop gain G, and the higher the minimum value of G, the less percentage change in the magnitude of $e_o$ will result from changes in the value of G to its maximum.

As indicated above, another highly desirable characteristic of an operational amplifier relates to its gain and phase shift as a function of frequency. If, in the above-described example of an operational amplifier in a voltage follower circuit, the gain of the operational amplifier were to be greater than unity at a frequency at which the closed-loop phase shift were 360°, the circuit would be unstable, i.e., it would oscillate. To prevent such oscillations, stability compensation is desirably provided for an operational amplifier.

Stability compensation for integrated-circuit operational amplifiers is normally accomplished by incorporating compensation circuitry that is said to create a dominant pole at a particular frequency. That is, the compensation circuitry operates somewhat like a low-pass filter which has little or no effect on open-loop gain at low frequencies and which reduces or rolls off the open-loop gain at frequencies above the dominant pole. The rate of roll-off of gain caused by a single pole is typically expressed as 20 db per decade; this means that the gain decreases by a factor of 10 as frequency increases by a factor of 10. A phase shift is introduced by each such pole; this phase shift asymptotically approaches 90°.

One prior art approach for providing stability compensation for an integrated-circuit operational amplifier is disclosed in U.S. Pat. No. 4,714,895. This approach relies upon switched-capacitor techniques by which a resistive load can be defined by periodically switching a capacitor into and out of connection with a circuit. An operational amplifier in accord with this approach involves a single-stage differential amplifier, 4 capacitors, and 4 clocked single-pole, double-throw switches that cooperate with the capacitors to define a common mode feedback circuit. This approach involves complexities including the need to provide clocking signals and to provide switching circuitry to implement the 4 switches. Further, as described in this patent at column 5, lines 4, et seq., the common-mode feedback circuit constitutes an internal load on the differential amplifier. As elsewhere indicated in this patent (column 2, lines 5, et seq.), the gain of a differential amplifier is affected by its loading. This loading tends to counteract a goal of providing high open-loop gain which is sought to be obtained in accord with this patent through use of complementary symmetry metal oxide semiconductor (CMOS) transistors, and the use of cascode circuits as in the differential amplifier.

Another prior art approach does not require the complexities involved with switched capacitor techniques. Instead, the operational amplifier has 2 stages, the first or input stage being a differential amplifier, the second stage being a single-ended stage comprising a signal-inverting transistor to which a compensation capacitor is connected to produce a so-called Miller effect. As to the Miller effect, this means that the second, single-ended stage capacitively loads the differential amplifier stage by an amount that is larger than the capacitance of the capacitor itself. In this regard, the capacitive loading on the input stage can be expressed as a ratio, the numerator being the magnitude of the current flowing between the two stages, and the denominator being the time rate of change of the voltage at the node at which the two stages are interconnected. The Miller effect is present when the numerator increases as a result of the opposite ends of the capacitor having oppositely-changing potentials.

For applications in which the open-loop gain needs to be very high, e.g., in excess of 10,000 (80 db), to maintain closed loop accuracy at d.c., an operational amplifier in accord with the above-described conventional approach requires an undesirably large compensation capacitor. This drawback is particularly acute in integrated circuits in which the transistors are metal oxide semiconductor (MOS) field effect transistors. In an operational amplifier in which an input-stage MOSFET differential amplifier is employed to drive a second-stage, single-ended, inverting MOSFET, it is extremely difficult to achieve stability compensation through use of the conventional approach of incorporating a capacitor connected between the drain and the gate of second-stage MOSFET. This conventional approach is particularly undesirable in an application in which the second-stage MOSFET is connected to drive current through a resistor instead of a high-resistance circuit such as an FET constant current source. Typical such applications involve precision current sources, and voltage ramp generators, particularly where small size is required. While driving current through a resistor, the second-stage MOSFET has significantly reduced drain impedance and resulting lower gain. Such lower gain undesirably reduces the intended Miller effect. For these reasons, the conventional approach is undesirably subject to instability where the load presented to the second-stage MOSFET affects its gain.

SUMMARY OF THE INVENTION

The present invention provides a stability-compensated, integrated-circuit operational amplifier having an open-loop gain versus frequency characteristic which provides stable and accurate closed-loop operation.

A stability-compensated, integrated-circuit operational amplifier in accord with the invention comprises an inverting node and a non-inverting node. The operational amplifier further includes a first differential amplifier comprising CMOS transistor means which are connected to the inverting node and the non-inverting node. The CMOS transistor means of the first differential amplifier has an output node, and produces on the output node an output potential that, with reference to a predetermined potential, defines an output signal having a magnitude that is a function of the magnitude of the difference between a first potential at the inverting node and a second potential at the non-inverting node. The operational amplifier further includes a second differential amplifier comprising CMOS transistor means which are connected to the inverting node and the non-inverting node. The CMOS transistor means of the second differential amplifier produces a compensation signal. The operational amplifier further includes capacitance means for coupling the compensation signal to the non-inverting node.

In a preferred embodiment, the operational amplifier is combined with other CMOS circuitry in the same integrated circuit to provide a precision current source. The other CMOS circuitry includes signal-inverting MOSFET means biased by the output potential to produce two parallel currents. One of the parallel currents flows through a resistance load to produce a potential that is directly applied to the non-inverting node. The other of the parallel currents flows into circuitry that provides a mirrored current output. The magnitude of the mirrored current output is precisely controlled by a reference potential applied to the inverting node. This precisely controlled current defines the reference current input for a digital-to-analog converter.

A noteworthy feature of the operation of the preferred embodiment relates to a pole-zero combination. As used in contrast to a pole, a zero introduces a phase shift in the opposite direction from a pole. Thus, where a pole is defined at a first frequency, and a zero is defined at a second, higher frequency, the net phase shift caused by the pole-zero combination asymptotically approaches 0°. In the preferred embodiment, the second differential amplifier inherently defines a pole. Because of that inherently defined pole, the roll-off effect of the capacitance means upon the first differential amplifier is effectively canceled throughout a range of frequencies. In a manner of speaking, the inherent pole of the second differential amplifier is converted to an operational amplifier zero.

BRIEF DESCRIPTION OF THE DRAWINGS

FIG. 2 comprises FIGS. 2A and 2B, each of which is a Bode plot of open-loop gain and phase shift versus frequency; the Bode plot of FIG. 2A applies to the operational amplifier of FIG. 1 without a capacitor, and the Bode plot of FIG. 2B applies to the operational amplifier with the capacitor.

DETAILED DESCRIPTION OF THE PREFERRED EMBODIMENT

Figure 1:
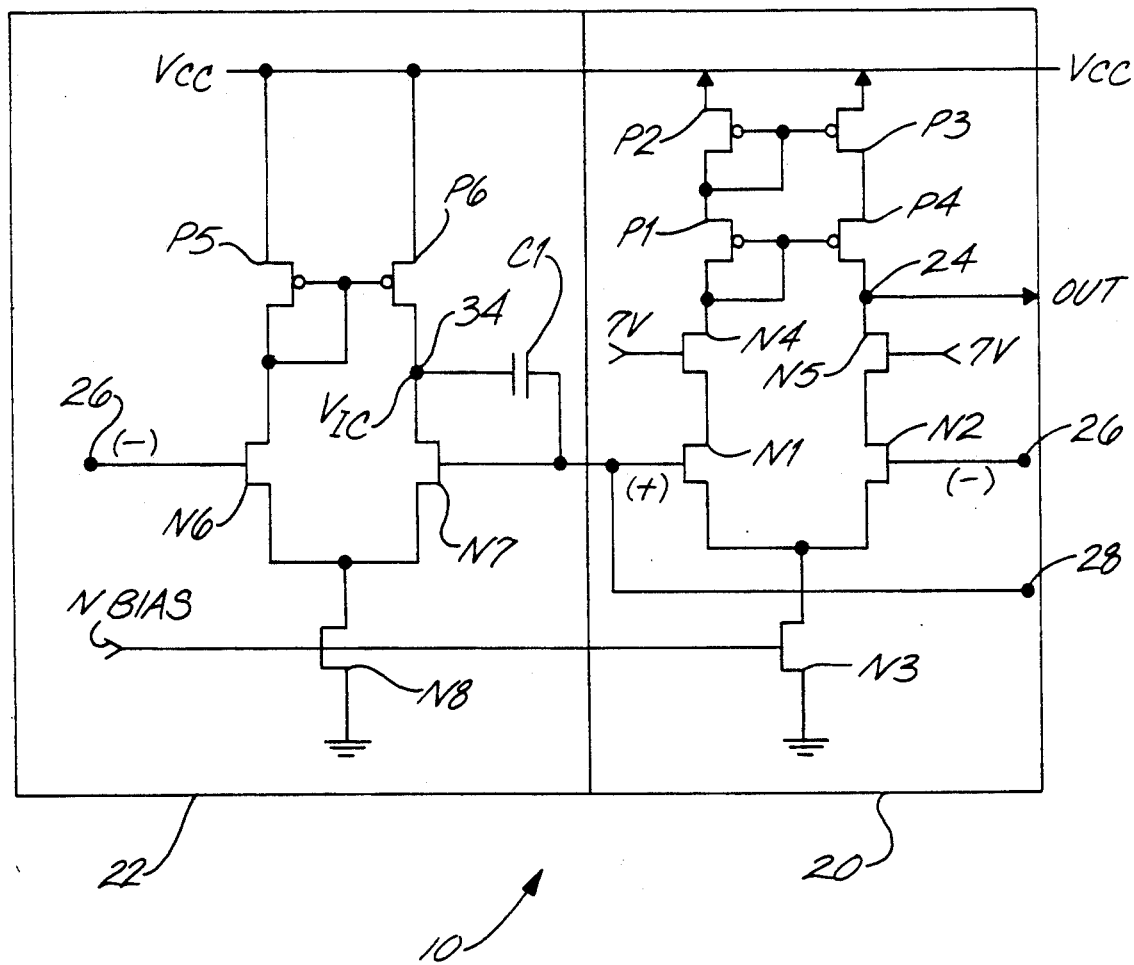
FIG. 1 is a schematic diagram of the preferred embodiment of the integrated-circuit operational amplifier of this invention.

The schematic diagram of FIG. 1 represents a CMOS integrated-circuit operational amplifier, generally indicated at 10. In accord with the preferred embodiment of this invention, the power supply voltage for the operational amplifier 10 is nominally 12 volts (indicated as $V_{cc}$ in FIGS. 1 and 2). Operational amplifier 10 comprises a first differential amplifier 20 and a second differential amplifier 22.

The first differential amplifier 20 comprises CMOS transistor means that are connected to an output node 24, to an inverting node 26, and to a non-inverting node 28. The CMOS transistor means produce on the output node an output potential that, with reference to a predetermined potential, defines an output signal having a magnitude that is a function of the magnitude of the difference between a first potential at the inverting node 26 and a second potential at the non-inverting node 28. The magnitude of the predetermined potential depends upon the magnitude of the power supply potential $V_{cc}$ (which is subject to tolerance) and on device parameters. In a specific embodiment, the magnitude of the predetermined potential is approximately 8 volts.

The second differential amplifier 22 comprises CMOS circuit means that are connected to the inverting node 26, to the non-inverting node 28, and to a node 34. The CMOS transistor means of the second differential amplifier 22 produce a compensation signal $V_{IC}$ on the node 34. The operational amplifier further includes capacitance means, indicated in FIG. 1 by capacitor C1 for coupling the compensation signal to the non-inverting node 28.

The CMOS transistor means of the first differential amplifier 20 includes n-channel MOSFETs N1 through N5 and p-channel MOSFETs P1 through P4. The non-inverting node 28 is connected to the gate of MOSFET N1. The inverting node 26 is connected to the gate of MOSFET N2. As is well known in this art, it is desirable for a differential amplifier to have a high common mode rejection ratio (CMRR), and to provide high gain in amplifying an input differential signal. With respect to differential amplifier 20, the differential signal is defined by the difference in the magnitudes of the potentials applied to the gates of MOSFETs N1 and N2. The sources of MOSFETs N1 and N2 are connected together and to the drain of n-channel MOSFET N3. The source of MOSFET N3 is connected to ground (0 volts), and the gate of MOSFET N3 is biased in a conventional manner by a bias potential NBIAS such that MOSFET N3 forms a substantially constant-current source (i.e., has high impedance) to enhance the common-mode rejection ratio (CMRR) of the differential amplifier 20 in accord with principles well known in this art.

To achieve high open-loop gain for improved d.c. accuracy of the operational amplifier, the differential amplifier 20 employs cascoded MOSFETs in each of the two current flow paths between the power supply potential $V_{cc}$ and the drains of MOSFETs N1 and N2. MOSFET N4 is in the current flow path for MOSFET N1, and MOSFET N5 is in the current flow path for MOSFET N2. MOSFETs N4 and N5 are commonly biased. In the preferred embodiment, the bias potential applied to the gates of MOSFETs N4 and N5 is 7 volts. MOSFETs P1 and P2 are in the current flow path for MOSFET N1, and each has its gate and drain connected together to define diode-connected MOSFETs. MOSFETs P3 and P4 are in the current flow path for MOSFET N2. MOSFET P3 has its gate connected to be biased by diode-connected MOSFET P2 so that the current flowing through it can mirror the current flowing through diode-connected MOSFET P2. MOSFET P4 has its gate biased by diode-connected MOSFET P1 to form a cascoded structure in conjunction with MOSFET P3.

The cascoded structure employed in differential amplifier 20 provides for an open-loop d.c. voltage gain exceeding 10,000 (80 db). The cascoded MOSFETs N4 and N5 in the two paths, being biased at 7 volts, provide an additional benefit of eliminating possible damage to the n-channel devices of the circuit that could otherwise occur as a result of impact ionization due to the 12 volt power supply potential.

The CMOS circuit means of the second differential amplifier 22 comprises n-channel MOSFETs N6 through N8, and p-channel MOSFETs P5 and P6. The inverting node 26 is connected to the gate of MOSFET N6. The non-inverting node 28 is connected to the gate of MOSFET N7. As with differential amplifier 20, the differential input signal for differential amplifier 22 is defined by the difference in the magnitudes of the potentials applied to the inverting node 26 and the non-inverting node 28. The sources of MOSFETs N6 and N7 are connected together and to the drain of n-channel MOSFET N8. The source of MOSFET N8 is connected to ground. MOSFET P5 is in the current flow path for MOSFET N6, and MOSFET P6 is in the current flow path for MOSFET N7. MOSFET P5 is a diode-connected MOSFET and biases the gate of MOSFET P6 in a current-mirror configuration.

The Bode plot of FIG. 2A shows the frequency dependence of the open-loop gain and phase margin (in number of degrees less than 360° phase shift) of the operational amplifier with capacitor C1 removed. The magnitude of the gain depends on various factors including operating conditions such as temperature and power supply potential, and including device tolerances. In a representative case, the open-loop gain at d.c. is in excess of 100 db. At a frequency between 10 Hz and 100 Hz, the open-loop gain begins to roll off at a rate of approximately 20 db per decade. At a frequency below 10 KHz, the roll-off rate increases to approximately 40 db for decade. The open-loop phase margin, measured between node 24 and inverting node 26, reaches 0° before the open-loop gain becomes less than unity. Thus, without compensation, the operational amplifier will not, in general, provide stable operation in a closed-loop configuration.

The Bode plot of FIG. 2B shows the frequency dependence of the open-loop gain and phase margin of the operational amplifier 10 with capacitor C1. In a representative case, the open-loop gain at d.c. is in excess of 100 db. At a frequency between 10 Hz and 100 Hz, the open-loop gain begins to roll off at a progressively-increasing rate, progressing from approximately 20 db per decade to nearly 40 db per decade. At a frequency between 1 KHz and 10 KHz, there is a point of inflexure in the slope of the open-loop gain curve such that within a range of frequencies extending to above 10 KHz, the roll-off rate is approximately 20 db per decade. At a frequency between 100 KHz and 1 MHz, the open-loop gain is unity.

The open-loop phase margin, as shown in FIG. 2B, reaches 0° at a frequency above the frequency at which the open-loop gain becomes less than unity. Thus, with compensation, the operational amplifier will, in general, provide stable operation in a closed-loop configuration.

With compensation, the operational amplifier has an additional low-frequency pole causing more rapid roll off of the open-loop gain in a low-frequency region, and causing a substantially reduced phase margin in that range of frequencies. Significantly, the operational amplifier has a zero causing a less rapid roll off, and causing the phase margin to increase as indicated by the upwardly sloping portion of the phase-margin curve. This zero is attributable to the following. The second differential amplifier 22 inherently defines a pole. Because of that inherently defined pole, the roll-off effect of the capacitance means upon the first differential amplifier 20 is effectively canceled throughout a range of frequencies. In a manner of speaking, the inherent pole of the second differential amplifier is converted to an operational amplifier zero.

Because of the compensation, high open-loop voltage gain exceeding 10,000 is therefore possible providing increased d.c. accuracy for the operational amplifier, without the problem of instability.

Figure 3:
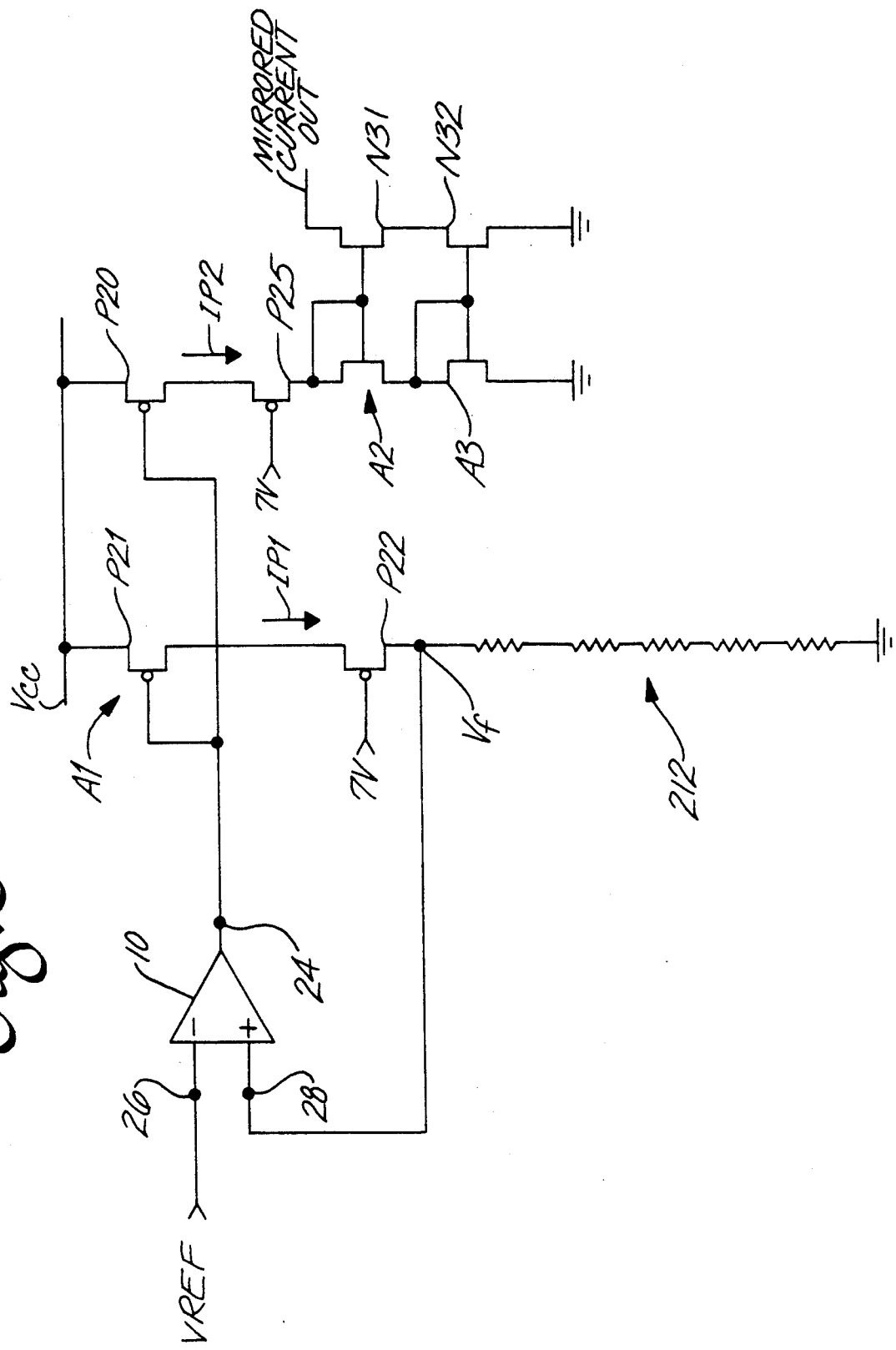
FIG. 3 is a schematic diagram of a combination of the operational amplifier with other CMOS circuitry to form a precision current source embodying the present invention.

In a preferred embodiment represented in the schematic of FIG. 3, the operational amplifier 10 is combined with other CMOS circuitry in the same integrated circuit to provide a precision current source. The other CMOS circuitry includes signal-inverting MOSFET means biased by the output potential to produce two parallel currents IP1 and IP2. One of the parallel currents, viz, current IP1, flows through a resistance load to produce a potential $V_f$ that is directly applied to the non-inverting node. The other of the parallel currents, viz. current IP2, flows into circuitry that provides a mirrored current output. The magnitude of the mirrored current output is precisely controlled by a reference potential applied to the inverting node. This precisely controlled current defines the reference current input for a digital-to-analog converter.

The signal-inverting MOSFET means comprises an array, generally indicated at A1, of p-channel MOSFETS including a MOSFET P20 which is positioned in the middle of the array. The sources of all the MOSFETs in array A1 are connected to the power supply potential $V_{cc}$, and the gates of all these MOSFETS are connected to the output node 24. To simplify the drawing, FIG. 2 represents 16 of the MOSFETs in the array with the symbol for a single p-channel FET P21. The drains of the 16 MOSFETs represented by FET P21 are connected together such that IP1 is the sum of the currents they produce. Each of the 17 MOSFETs in array A1 has the same channel width to channel length ratio, viz, 19 microns to 19 microns. Placing MOSFET P20 in the middle of the array, i.e., 8 MOSFETs are on one side and 8 MOSFETs are on the opposite side, ensures that the magnitude of current IP1 is very close to being 16 times the magnitude of current IP2, notwithstanding gradients in device tolerances.

A p-channel MOSFET P22 has its gate connected to be biased by the 7-volt bias potential, has its source connected to the common drains of the 16 MOSFETs, and has its drain connected to the resistance means and to the non-inverting node 28. The resistance means comprises a series of 5 polysilicon-defined resistors generally indicated at 212. The polysilicon strips that define these resistors are, in each case, 936 microns long and 8 microns wide.

In the current flow path for current IP2, there is a p-channel MOSFET P25, an array A2 of 4 n-channel MOSFETs represented for simplicity as a single MOSFET, and an array A3 of 4 n-channel MOSFETs represented for simplicity as a single MOSFET. Each of the 4 MOSFETs of array A2 is diode-connected, with the common gate-drain defining a bias potential for the gate of an n-channel MOSFET N31. Each of the 4 MOSFETs of array A3 is diode-connected, with the common gate-drain defining a bias potential for the gate of an n-channel MOSFET N32, which is connected in series with MOSFET N31.

In operation, a voltage reference potential VREF is applied to the inverting node 26. A potential $V_f$ developed across the external load of polysilicon resistors is fed back to be applied to the non-inverting node 28. The feedback potential is compared to the VREF for adjustment of the bias voltage applied to the gates of the 17 MOSFETS in array A1. Because operational amplifier 10 has such high open-loop d.c. gain, the potential $V_f$ is almost identical to the potential VREF.

Together, the operation amplifier 10 and other circuit elements disclosed in FIG. 3 provide a means of converting a full scale input current, VREF/RF (full scale, or voltage, VREF) into an LSB input bios current for a digital-to-analong converter. The array A1 alternates very accurately the full scale current to VREF/16RF. The array A3 formed by N-channel further alternates the full scale current devices very accurately to VREF/6ARF.

The operational amplifier of the present invention may be used in an integrated circuit that includes a digital-to-analog converter as described in a patent application by T. O'Shaughnessy and R. Hull for INTEGRATED-CIRCUIT DIGITAL-TO-ANALOG CONVERTER, filed on the same date as the present application and having the same assignee, the disclosure of which is incorporated herein by reference. Additionally, the operational amplifier according to the present invention may be used in creating precision resistor elements in accord with the teachings of U.S. Pat. No. 4,868,482, referred to above.

We claim:

1. A stability-compensated, integrated-circuit operational amplifier comprising:
   an inverting node and a non-inverting node;
   a first differential amplifier comprising CMOS transistor means that are connected to the inverting node and to the non-inverting node, the CMOS transistor means of the first differential amplifier having an output node, and having means for producing on the output node an output potential that, with reference to a predetermined potential, defines an output signal having a magnitude that is a function of the magnitude of the difference between a first potential at the inverting node and a second potential at the non-inverting node;
   a second differential amplifier comprising CMOS transistor means that are connected to the inverting node and to the non-inverting node, the CMOS transistor means for having means for producing a compensation signal; and
   capacitance means for coupling the compensation signal to the non-inverting node.

2. A stability-compensated, integrated-circuit operational amplifier in accord with claim 1, wherein the first differential amplifier comprises a current-source biased differential input stage with cascoded differential legs and a current mirror active load also cascoded for increased gain.

3. A stability-compensated, integrated-circuit operational amplifier in accord with claim 2, wherein the second differential amplifier comprises a current-source biased differential input stage and a current mirror active load.

4. An integrated-circuit precision-current source comprising:
   an operational amplifier comprising:
      an inverting node to which a reference potential is applied;
      a non-inverting node to which a feedback potential is applied;
      a first differential amplifier comprising CMOS transistor means that are connected to the inverting node and to the non-inverting node, the CMOS transistor means of the first differential amplifier having an output node, and having means for producing on the output node an output potential that, with reference to a predetermined potential, defines an output signal having a magnitude that is a function of the magnitude of the difference between the reference potential and the feedback potential;

a second differential amplifier comprising CMOS transistor means that are connected to the inverting node and to the non-inverting node, the CMOS transistor means for having means for producing a compensation signal; and capacitance means for coupling the compensation signal to the non-inverting node;

resistance-loaded signal-inverting MOSFET means defining a first current flow path, and biased by the output potential for controlled current flow through the first flow path to produce the feedback potential; and signal-inverting MOSFET means biased by the output potential to produce a current in a second path in parallel with the first path.

5. An integrated-circuit precision-current source in accord with claim 4, and further comprising CMOS circuit means for mirroring the current flowing in the second path.

6. An integrated-circuit precision-current source in accord with claim 4, wherein the signal-inverting MOSFET means comprise a plurality of MOSFETs positioned in an array.

7. An integrated-circuit precision-current source comprising:

an operational amplifier comprising:

a pair of nodes defining an inverting node and a non-inverting node, to one of which a reference potential is applied and to the other of which a feedback potential is applied;

a first differential amplifier comprising CMOS transistor means that are connected to the inverting node and to the non-inverting node, the CMOS transistor means of the first differential amplifier having an output node, and having means for producing on the output node an output potential that, with reference to a predetermined potential, defines an output signal having a magnitude that is a function of the magnitude of the difference between the reference and feedback potentials;

a second differential amplifier comprising CMOS transistor means that are connected to the inverting node and to the non-inverting node, the CMOS transistor means for having means for producing a compensation signal; and capacitance means for coupling the compensation signal to the node to which the feedback potential is applied;

resistance-loaded MOSFET means defining a first current flow path, and biased by the output potential for controlled current flow through the first flow path to produce the feedback potential; and MOSFET means biased by the output potential to produce a current in a second path in parallel with the first path.

8. An integrated-circuit precision-current source in accord with claim 7, and further comprising CMOS circuit means for mirroring the current flowing in the second path.

* * * * *